United States Patent
Geefay et al.

(10) Patent No.: US 6,787,897 B2
(45) Date of Patent: Sep. 7, 2004

(54) WAFER-LEVEL PACKAGE WITH SILICON GASKET

(75) Inventors: Frank S Geefay, Cupertino, CA (US); Qing Gan, Fremont, CA (US); Ann Mattos, San Jose, CA (US); Domingo A Figueredo, Union City, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/028,058

(22) Filed: Dec. 20, 2001

(65) Prior Publication Data

US 2003/0116825 A1 Jun. 26, 2003

(51) Int. Cl.⁷ .............................................. H01L 23/48
(52) U.S. Cl. ...................... 257/704; 174/52.2; 174/52.4
(58) Field of Search .................................. 257/619, 704, 257/705, 784, 787; 174/52.2–52.6; 361/762–764, 785; 438/107, 125, 700, 455, 456

(56) References Cited

U.S. PATENT DOCUMENTS

| 6,228,675 | B1 | | 5/2001 | Ruby |
| 6,229,404 | B1 | * | 5/2001 | Hatanaka ...................... 331/68 |
| 6,265,246 | B1 | | 7/2001 | Ruby |
| 6,285,067 | B1 | * | 9/2001 | Hyoudo et al. .............. 257/529 |
| 6,359,333 | B1 | * | 3/2002 | Wood et al. ................. 257/704 |
| 6,453,749 | B1 | * | 9/2002 | Petrovic et al. ............... 73/754 |
| 6,470,594 | B1 | * | 10/2002 | Boroson et al. .............. 34/335 |
| 6,489,679 | B2 | * | 12/2002 | Tsukiyama et al. ......... 257/728 |

* cited by examiner

*Primary Examiner*—Kamand Cuneo
*Assistant Examiner*—Lourdes (Elle) Cruz
(74) *Attorney, Agent, or Firm*—Judy Liao Shie

(57) ABSTRACT

A gasket encloses a hermetically sealed environment between a cap wafer and a base wafer. The gasket is bonded to the base wafer using bonding material. The bonding material can be one or more of many substances that exhibit acceptable adhesion, sealing, and other properties that ensure a hermetically sealed environment. The gasket is carved out from the cap wafer material itself. The cap wafer is typically made of extremely strong and rigid material such as silicon. Since the gasket is made from the cap wafer, the gasket itself is also extremely strong and rigid.

13 Claims, 7 Drawing Sheets

WAFER-LEVEL PACKAGE WITH SILICON GASKET

FIELD OF THE INVENTION

The present invention is directed towards semiconductor packaging techniques, and more specifically, towards the fabrication of wafer-level packages.

BACKGROUND OF THE INVENTION

Many semiconductor devices are sensitive to contamination, humidity, and other such environmental factors. To protect them from harm, the devices must be put in a hermetically sealed package. In the past, a device had to first be cut or otherwise separated from its wafer before it could be put into a package. In wafer-level packaging, packaging is performed while the device remains on the wafer. In this fashion, hundreds or thousands of packages can be created simultaneously, and then separated by sawing or other means.

FIG. 1 illustrates an exemplary wafer-level package 101. A first wafer 102 has a gasket 103 bonded to a second wafer 107, creating a hermetically sealed environment 109 between the two wafers to protect a device 111. Only a portion of wafer 102 and wafer 107 are shown in the figure, but there can be hundreds or thousands of such wafer-level packages formed simultaneously between the two wafers. The gasket 103 is created by depositing material such as metal or a polyimide onto wafer 102 in the desired gasket shape. The two wafers are then bonded together at the gasket. This method is effective in creating hermetically sealed environment 109. However, the deposited material is not very rigid, and is prone to deformation when pressure is applied during the bonding process. Since much of the applied pressure is used up by gasket deformation, very little of the applied pressure actually transfers to the bond juncture itself. Therefore, more pressure has to be applied for a longer period of time to create the bond. Furthermore, the process of depositing material creates an irregular gasket bonding surface, which causes problems during bonding. Finally, it is difficult to precisely control the geometry of the gasket, since the deposited material tends to shrink or change shape during the deposition process.

SUMMARY OF THE INVENTION

In accordance with an illustrated preferred embodiment of the present invention, a gasket for a wafer-level package is carved out from the wafer material itself. The wafer is typically made of silicon, although materials such as glass, 3–5 compounds, ceramics, plastics or other materials can be used. Silicon is extremely rigid, and therefore an ideal gasket material. When pressure is applied during bonding, the silicon gasket will not deform, and the applied pressure is concentrated at the bond juncture. As a result, it takes less force and/or time to bond the wafer-level package. Furthermore, the original wafer surface is manufactured to be extremely flat. Since the gasket surface is the original wafer surface, the gasket will also have an extremely flat surface, which facilitates a uniformly tight bond.

The present invention also uses existing silicon etching technology that offers high precision in both etch depth and gasket width when carving out the desired shape. This allows greater control over the dimensions of the hermetically sealed cavity. Also, due to the high strength of silicon, the gaskets can be made narrower than in the past—usually no more than 10 μm wide. The surface area of the gasket determines the amount of pressure on the bond juncture during bonding for a given bonding force. Since a narrower gasket has less surface area, it is able to concentrate more of the applied bonding force at the bond juncture to create a strong seal.

Further features and advantages of the present invention, as well as the structure and operation of preferred embodiments of the present invention, are described in detail below with reference to the accompanying exemplary drawings. In the drawings, like reference numbers indicate identical or functionally similar elements.

DETAILED DESCRIPTION

Figure 1:
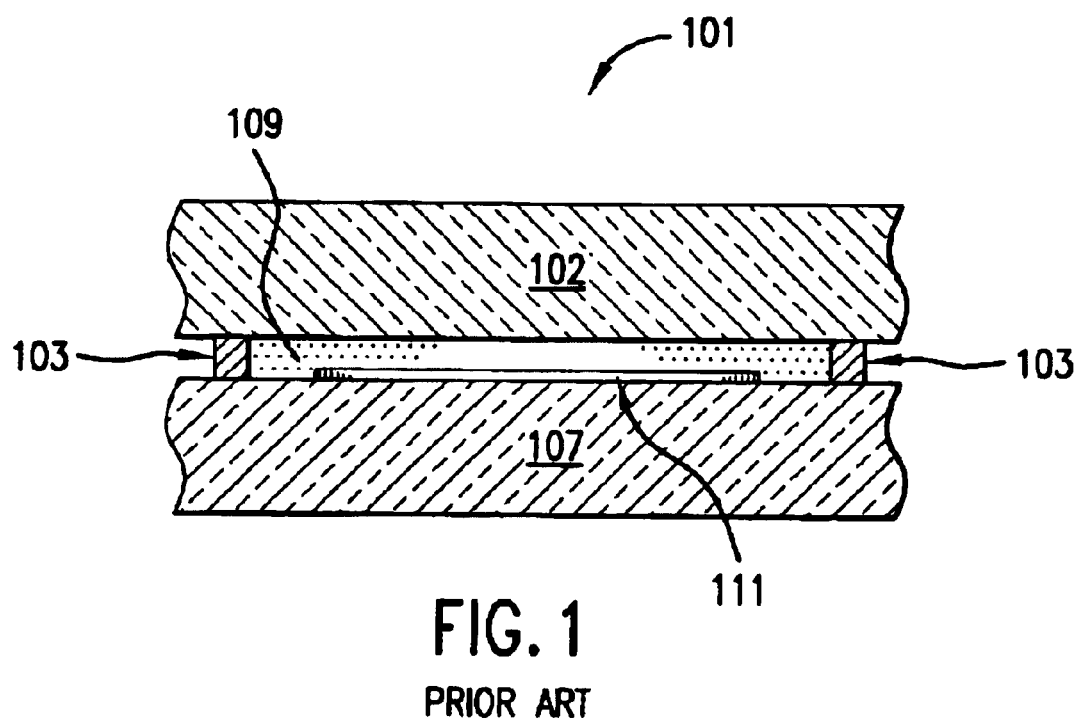
FIG. 1 shows a cross-sectional view of a prior art wafer-level package.
Figure 2A:
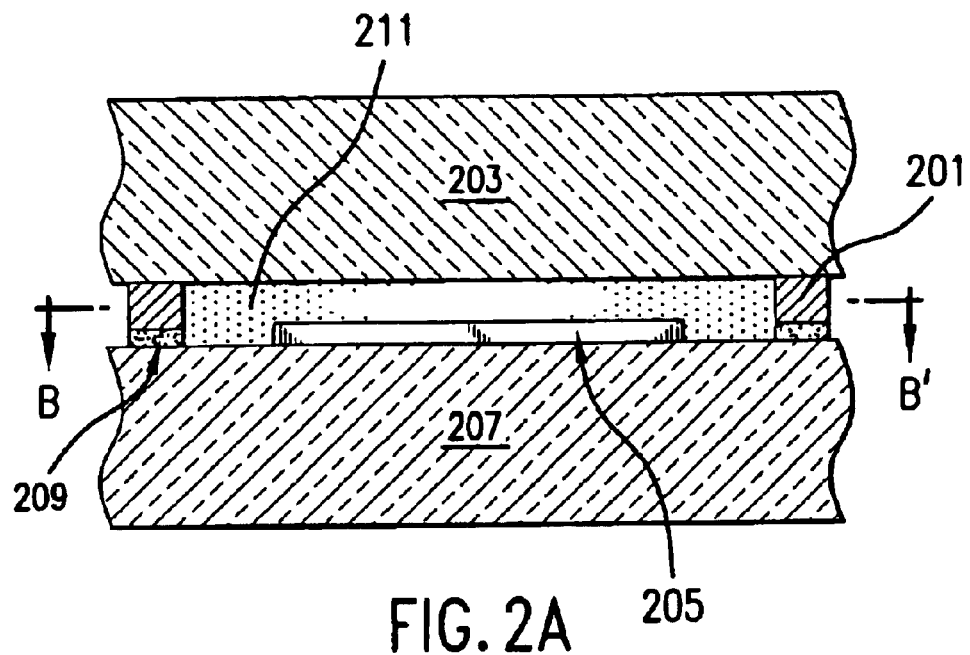
FIG. 2A shows a cross-sectional view of the present invention.

FIG. 2A shows a cross-sectional view of a preferred embodiment made in accordance with the teachings of the present invention. A gasket 201 on a cap wafer 203 surrounds and seals off a device 205 fabricated on a base wafer 207. Device 205 is any microelectronic device such as a microelectromechanical system (MEMS) structure or electronic circuit. Typically, the wafers are made of silicon. The wafers can also be made of glass, ceramics, or other semiconductor material, without departing from the scope of the present invention.

Figure 2B:
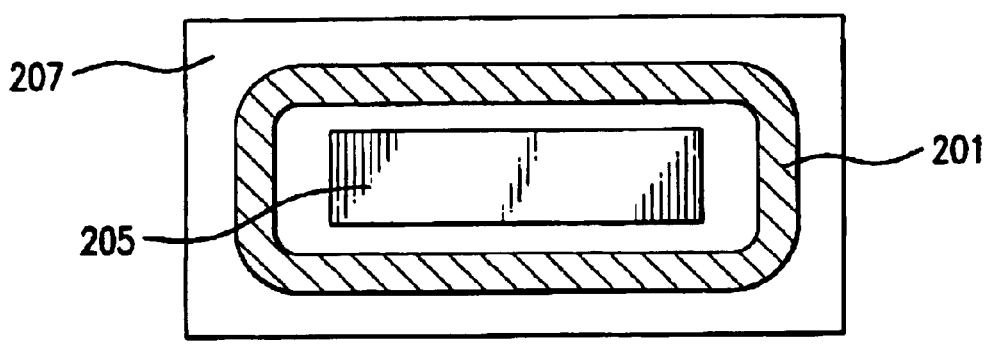
FIG. 2B shows a top-down view of the present invention, taken along the line B–B' in FIG. 2A.

FIG. 2B shows a top-down view of the present invention, taken along the line B–B' in FIG. 2A. As can be seen more clearly in FIG. 2B, gasket 201 completely surrounds and encloses device 205. Although gasket 201 is shown as an oblong, gasket 201 can be a square, circle, oval, rectangle, or any other shape that will enclose device 205.

Referring back to FIG. 2A, gasket 201 is carved or etched out of cap wafer 203 and bonded to base wafer 207 with bonding material 209. Bonding material 209 may be one or more of many substances that exhibit acceptable adhesion, sealing, hermeticity, and other properties that ensure device 205 is not damaged by the external environment. Bonding material 209 can be either conductive or non-conductive. A hermetically sealed environment 211 is created between cap wafer 203 and base wafer 207 to protect device 205. The hermetically sealed environment 211 can be a complete vacuum, or filled with an inert gas or other substance.

FIGS. 3A–3E show the fabrication of a wafer-level package in which the gasket is bonded with conductive bonding material.

Figure 3A:
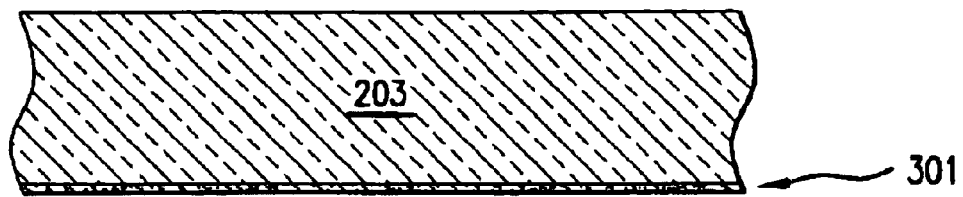
FIGS. 3A–3E show the fabrication of a wafer-level package in which the gasket is bonded with conductive bonding material.

FIG. 3A shows cap wafer 203. Cap wafer 203 is typically made of very high resistivity float zone silicon to avoid RF coupling problems with device 205 (not shown). Conductive bonding material 301 is applied to the surface of cap wafer 203. Possible conductive bonding materials are gold, gold-tin alloys, palladium-tin alloys, tin-lead lead alloys, and other metals.

Figure 3B:
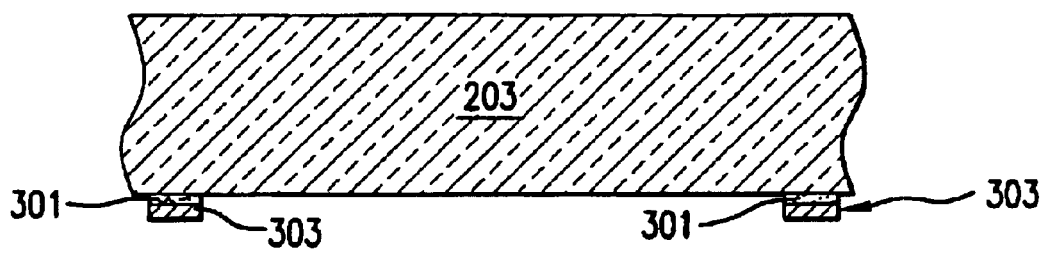

In FIG. 3B, conductive bonding material 301 is patterned with photoresist 303, then exposed and developed using any conventional photolithographic process to remove selected portions of the conductive bonding material 301.

Figure 3C:
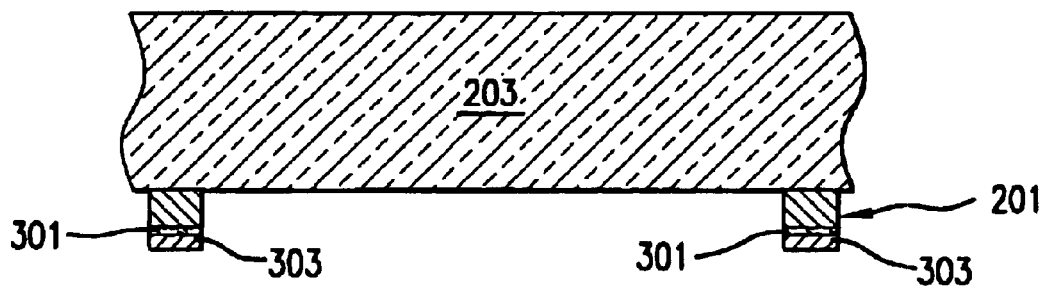

In FIG. 3C, the existing photoresist 303 is used as a mask to etch cap wafer 203. Selected portions of the cap wafer material are removed to create gasket 201. Any conventional etching process may be used, such as reactive ion etching (RIE) or deep reactive ion etching (DRIE). Gasket 201 is created from the same material as cap wafer 203. Usually, the material is silicon, which has good rigidity and hermeticity. In actual working embodiments, gasket 201 is between 3–12 µm wide and 4–10 µm deep. Other sizes for the gasket width and depth can be used to achieve the same purpose. Photoresist 303 is removed after gasket 201 is formed.

Figure 3D:
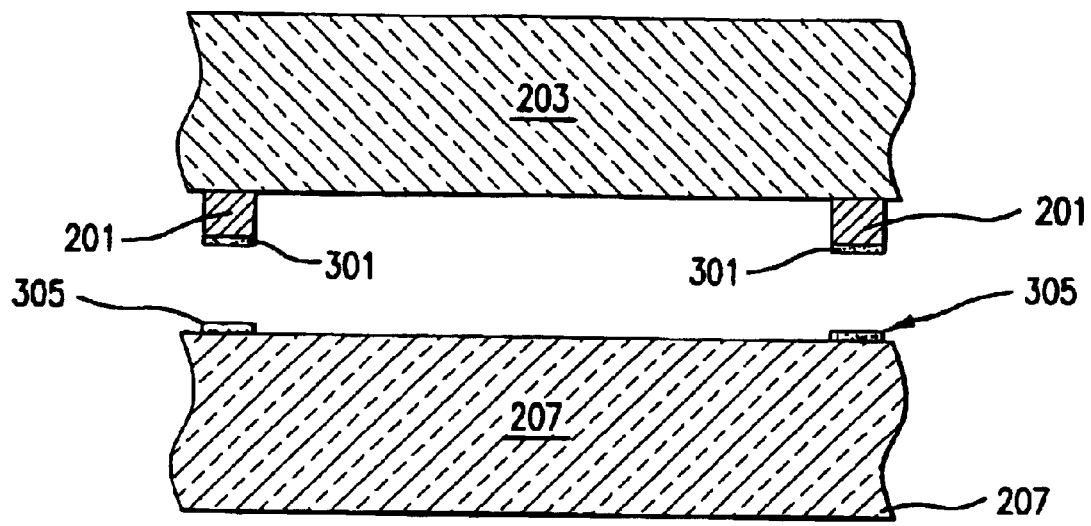

FIG. 3D shows the alignment of gasket 201 with a mating pad 305 on base wafer 207. Mating pad 305 can be made of any material that will bond with conductive bonding material 301. For example, if conductive bonding material 301 is gold, mating pad 305 can be made of gold, gold-tin alloy, tin-lead alloy, etc.

Figure 3E:
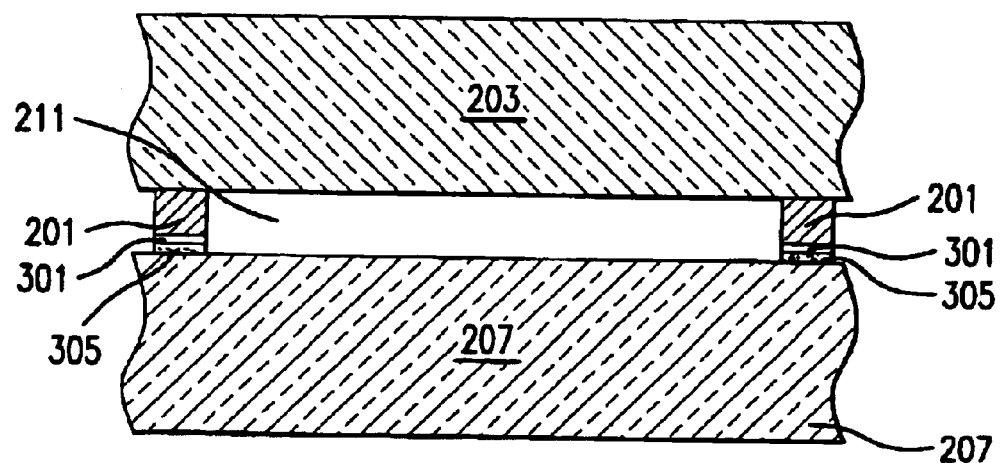

In FIG. 3E, cap wafer 203 and base wafer 207 are bonded together to create hermetically sealed environment 211. Appropriate force and temperature are used during bonding for the system and gasket area. In an actual working embodiment, in which conductive bonding material 301 and mating pad 305 were both gold, a force of 20 kiloNewtons was applied at 330° Celsius for 5–10 minutes to achieve an effective bond. These values are disclosed for illustrative purposes only. It should be understood that these values can vary while still achieving the same bonding result. For example, if the applied force is reduced to 8 kiloNewtons, it will take 20 to 40 minutes at 330° Celsius to achieve an effective bond. The best results are achieved when the bonding is performed in a vacuum environment, or in an inert gas such as nitrogen. The bonded wafers may be thinned down by conventional means if necessary.

The steps shown in FIGS. 3A–3E teach depositing conductive bonding material 301 onto gasket 201 before cap wafer 203 and base wafer 207 are bonded together. Alternatively, the conductive bonding material 301 can be deposited onto mating pad 305 instead of gasket 201, or on both mating pad 305 and gasket 201, to achieve the same bond in the wafer-level package.

FIGS. 4A–4E show the fabrication of a wafer-level package having a gasket bonded with non-conductive bonding material.

Figure 4A:
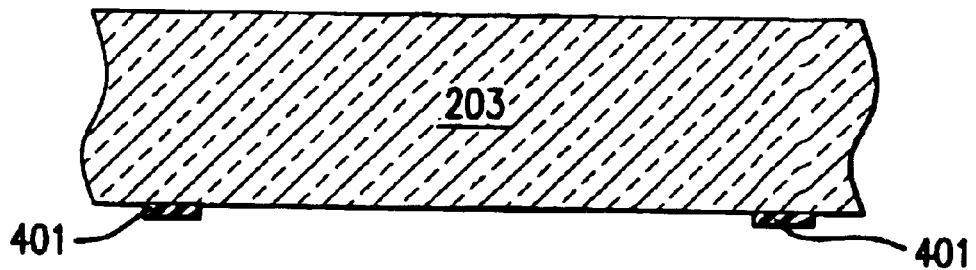
FIGS. 4A–4E show the fabrication of a wafer-level package in which the gasket is bonded with using non-conductive bonding material.

FIG. 4A shows cap wafer 203 with non-conductive bonding material 401 already patterned in the shape of a gasket. An advantage to using non-conductive bonding material 401 is that signal leads can be safely routed under the gasket. Possible choices for non-conductive materials are polyimide, B-staged bisbenzocyclobutene (BCB), other polymers, or glass. These materials may or may not be photosensitive. When non-conductive bonding material 401 is photosensitive, it can be shaped using conventional photolithography. When non-conductive bonding material 401 is not photo sensitive, a masking process is needed to shape non-conductive bonding material 401 into the desired pattern.

Figure 4B:
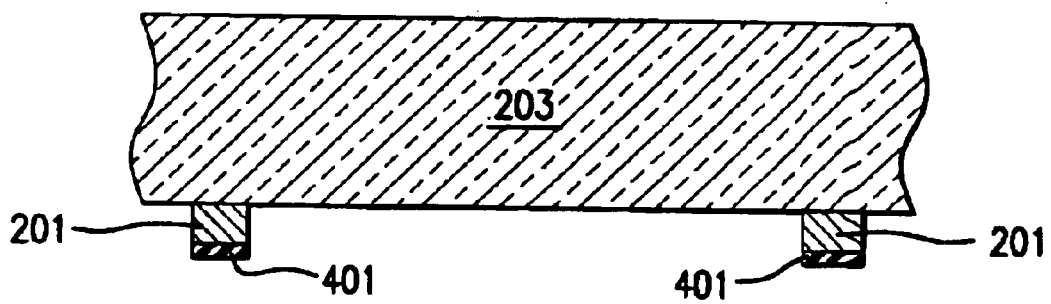

In FIG. 4B, portions of cap wafer 203 are removed to create gasket 201, using any standard etching process such as RIE or DRIE. The existing non-conductive material 401 is used as a mask to etch gasket 201.

Figure 4C:
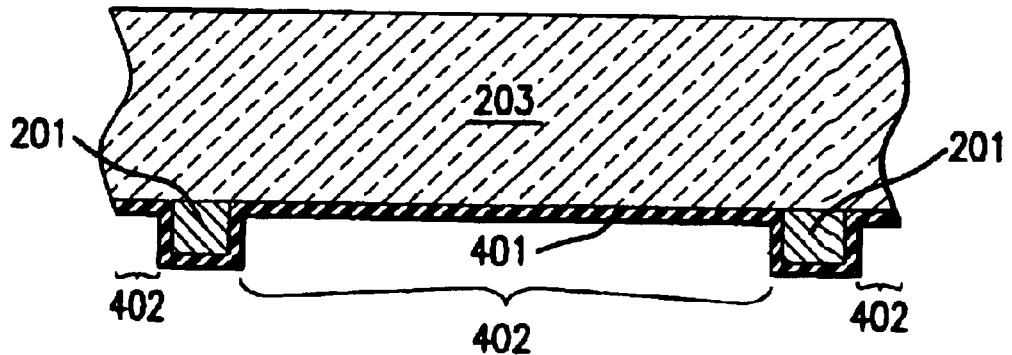

FIG. 4C shows an alternative method for applying non-conductive bonding material 401. Gasket 201 can be created first before a layer of non-conductive bonding material 401 is applied to the entire surface of cap wafer 203. Although the bonding material will be on areas 402 as well as on the gasket bonding surface, those areas 402 can be left on cap wafer 203 since the material is non-conductive. An additional masking step can be used to remove the bonding material in areas 402, if so desired.

Figure 4D:
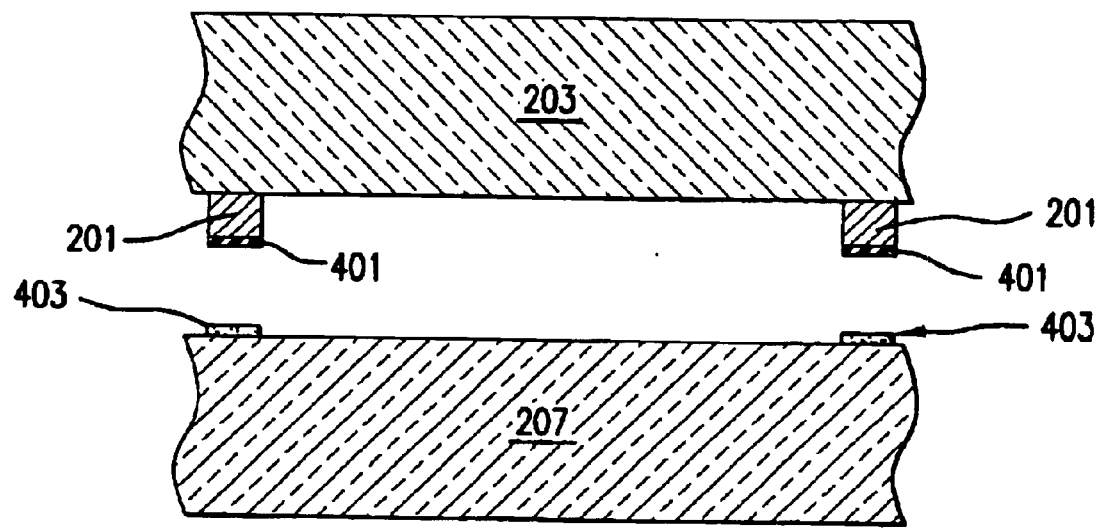

FIG. 4D shows the alignment of gasket 201 with a mating pad 403 on base wafer 207. Mating pad 403 can be made of any material that will bond with non-conductive bonding material 401. For example, if non-conductive bonding material 401 is a polyimide, mating pad 403 can be a polyimide as well. To enhance the bonding, mating pad 403 can be treated with an adhesion promoter such as tantalum carbide (TaC) or silicon carbide (SiC). TaC and SiC both have excellent adhesion to silicon, and also form either chemical or covalent bonds with polymer. The adhesion promoter can be applied by chemical vapor deposition (CVD), sputtering, or other similar thin film deposition process, then patterned by photo masking and etching processes. Alternatively, gasket 201 can bond directly to base wafer 207 without mating pad 403. An adhesion promoter can still be used to enhance the bonding process.

Figure 4E:
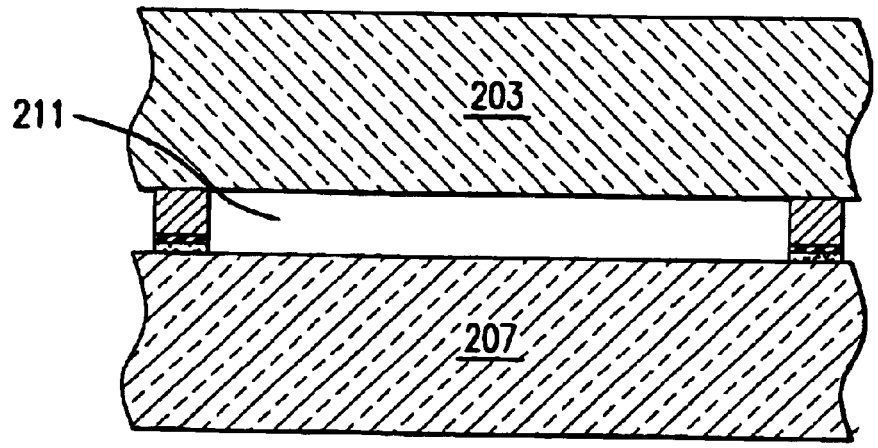

In FIG. 4E, cap wafer 203 and base wafer 207 are bonded together to create hermetically sealed environment 211. Appropriate force and temperature are used during bonding for the system and gasket area. The best results are achieved when the bonding is performed in a vacuum environment, or in an inert gas such as nitrogen. The bonded wafers may be thinned down by conventional means if necessary.

The steps shown in FIGS. 4A–4E teach depositing non-conductive bonding material 401 onto gasket 201 before cap wafer 203 and base wafer 207 are bonded together. Alternatively, the non-conductive bonding material 401 can be deposited onto mating pad 403 instead of gasket 201, or onto both mating pad 403 and gasket 201, to achieve the same bond in the wafer-level package. Or, if a mating pad 403 is not used, the non-conductive bonding material 401 can be deposited directly onto base wafer 207 at the bonding site.

Figure 5:
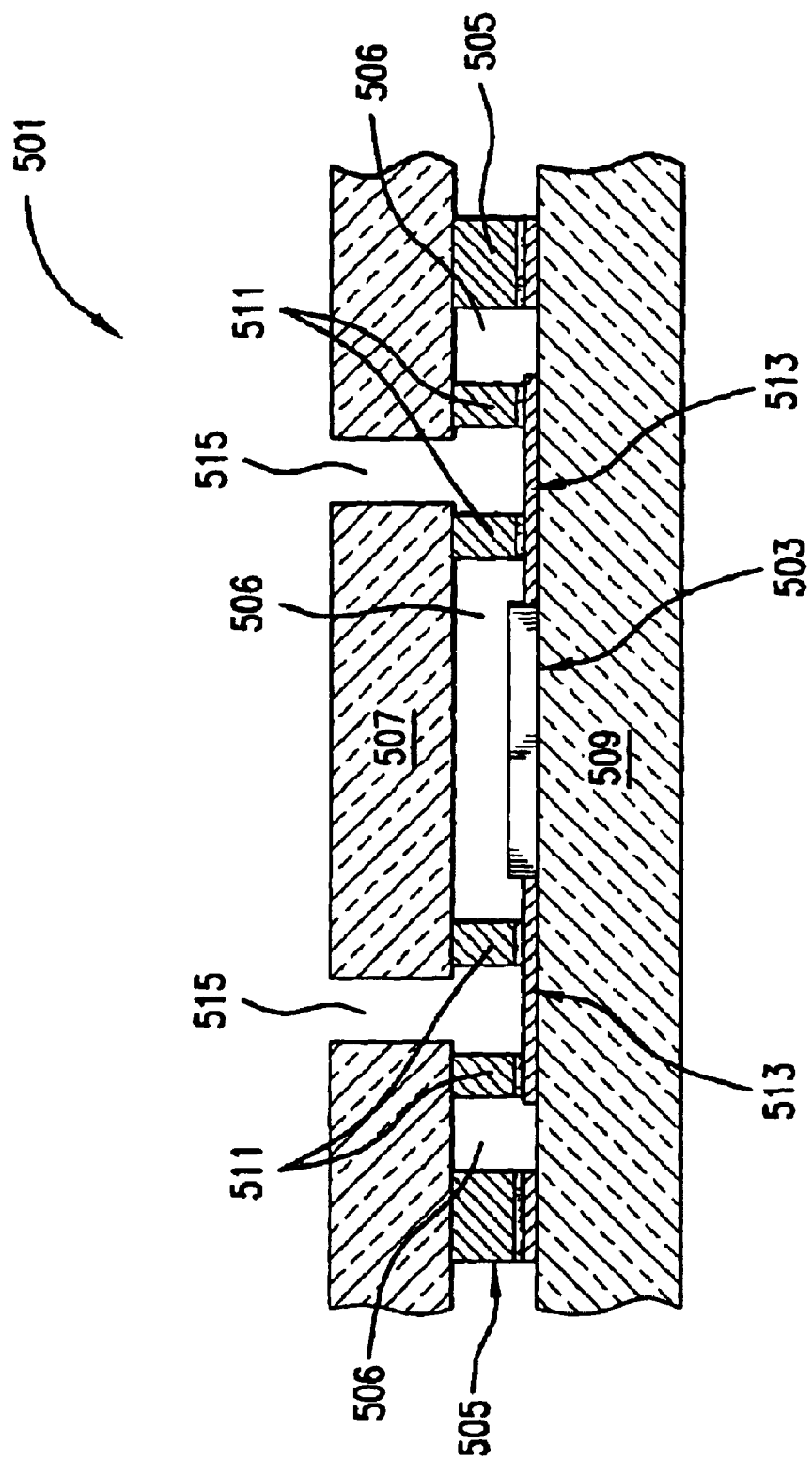
FIG. 5 shows alternative gasket configurations in a wafer-level package.

FIG. 5 shows alternative gasket configurations in a wafer-level package 501. When device 503 needs to make contact to the external environment while remaining within a hermetically sealed environment, multiple levels of gaskets can be used. A main outer gasket 505 creates a hermetically sealed environment 506 between cap wafer 507 and base wafer 509. Holes 515 in cap wafer 507 allow access to contact pads 513. Secondary inner gaskets 511 seal off holes 515 from the hermetically sealed environment 506, keeping device 503 protected.

Although the present invention has been described in detail with reference to particular preferred embodiments, persons possessing ordinary skill in the art to which this invention pertains will appreciate that various modifications and enhancements may be made without departing from the spirit and scope of the claims that follow. For instance, a device can be fabricated onto the cap wafer itself. Also, multiple layers of caps can be stacked on top of one another.

We claim:

1. A wafer-level package, comprising:
   a first semiconductor wafer having an elevated portion and an etched lower surface, wherein the elevated portion has a flat surface original to the semiconductor wafer amid surrounds an area of the etched lower surface;

a device fabricated on the first semiconductor wafer;

a second semiconductor wafer;

a pad on the second semiconductor wafer, substantially matching the gasket elevated portion; and bonding material joining the elevated portion and the pad to enclose the device within a hermetically sealed environment between the first and second semiconductor wafers.

2. The wafer-level package of claim 1 wherein the first wafer is formed of silicon.

3. The wafer-level package of claim 2 wherein the elevated portion is no more than 20 µm wide.

4. The wafer-level package of claim 3 wherein the elevated portion is no more than 10 µm wide.

5. The wafer-level package of claim 3 wherein the bonding material includes conductive bonding material.

6. The wafer-level package of claim 5 wherein the conductive bonding material is a metal selected from the group consisting of gold, gold-tin, tin-lead, and palladium-tin.

7. The wafer-level package of claim 3 wherein the bonding material includes non-conductive bonding material.

8. The wafer-level package of claim 7 wherein the non-conductive bonding material is a material selected from the group consisting of polyimide, B-staged bisbenzocyclobutene (BCB), and glass.

9. A wafer-level package, comprising:

a first semiconductor wafer having an elevated portion and an etched lower surface, wherein the elevated portion has a flat surface original to the semiconductor wafer and surrounds an area of the etched lower surface;

a device fabricated on the first semiconductor wafer;

a second semiconductor wafer;

bonding material joining the elevated portion and the second semiconductor wafer to enclose the device within a hermetically sealed environment between the first and second semiconductor wafers.

10. The wafer-level package of claim 9, wherein the elevated portion is less than 20 µm wide.

11. The wafer-level package of claim 10, wherein the elevated portion is less than 10 µm wide.

12. The wafer-level package of claim 10, wherein the bonding material is non-conductive.

13. The wafer-level package of claim 12, wherein the non-conductive bonding material is selected from the group consisting of polyimide, B-staged bisbenzocyclobutene (BOB), and glass.

* * * * *